United States Patent
Cocchini et al.

(10) Patent No.: US 10,184,962 B2
(45) Date of Patent: Jan. 22, 2019

(54) REMOVABLE TRANSIENT VOLTAGE DETECTOR

(71) Applicant: INTERNATIONAL BUSINESS MACHINES CORPORATION, Armonk, NY (US)

(72) Inventors: Matteo Cocchini, Long Island City, NY (US); Michael A. Cracraft, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 15/275,532

(22) Filed: Sep. 26, 2016

(65) Prior Publication Data

US 2018/0088157 A1    Mar. 29, 2018

(51) Int. Cl.
*G01R 19/00* (2006.01)
*G01R 19/165* (2006.01)
*G01R 1/20* (2006.01)

(52) U.S. Cl.
CPC ... *G01R 19/16576* (2013.01); *G01R 19/0053* (2013.01); *G01R 1/206* (2013.01)

(58) Field of Classification Search
USPC ................................. 324/426–435
See application file for complete search history.

(56) References Cited

U.S. PATENT DOCUMENTS

| | | | |
|---|---|---|---|
| 3,639,833 A | 2/1972 | Tachick | |
| 3,753,089 A | 8/1973 | Gunn et al. | |
| 3,870,953 A | 3/1975 | Boatman et al. | |
| 4,025,916 A * | 5/1977 | Arnold | G01R 19/16542 320/136 |
| 4,174,805 A | 11/1979 | Fulks et al. | |
| 6,222,450 B1 * | 4/2001 | Clements | B65F 1/1415 209/219 |
| 6,512,361 B1 | 1/2003 | Becker | |
| 7,768,292 B1 | 8/2010 | Koch | |
| 2008/0252277 A1 * | 10/2008 | Sase | H02M 3/157 323/283 |
| 2010/0201386 A1 | 8/2010 | Roelvink | |
| 2011/0043220 A1 * | 2/2011 | Leibowitz | G06F 1/26 324/613 |
| 2012/0268136 A1 | 10/2012 | Lee et al. | |

* cited by examiner

*Primary Examiner* — Vincent Q Nguyen
(74) *Attorney, Agent, or Firm* — Michael O'Keefe

(57) ABSTRACT

An apparatus and method for detecting transient voltage at an electrical component of a circuit board is provided. The apparatus including a circuit including a comparator and a latch, wherein a first input of the comparator is electrically coupled to the electrical component, and the comparator receives a threshold voltage at a second input, where the comparator outputs either a high signal or a low signal in response to both the first input and the second input, and an output of the comparator is electrically coupled to an input of the latch such that the latch outputs a high signal in response to receiving a high signal from the comparator, and an indicator electrically coupled to an output of the latch, and where the apparatus is mounted non-permanently to the circuit board to provide a non-permanent electrical coupling between the comparator and the electrical component.

8 Claims, 6 Drawing Sheets

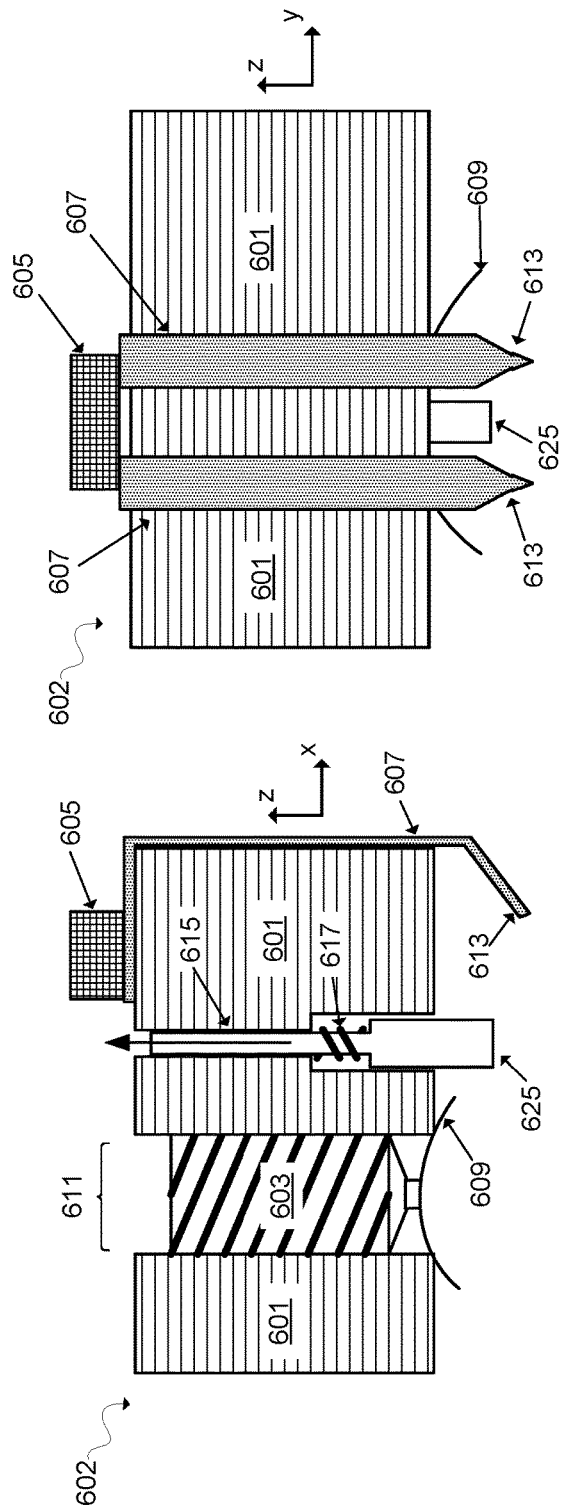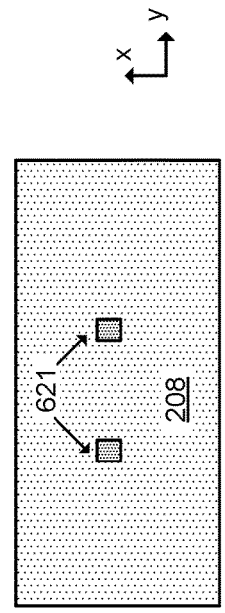

REMOVABLE TRANSIENT VOLTAGE DETECTOR

BACKGROUND

Embodiments of the present invention relate generally to testing of electronic devices, and more particularly to a structure and method of measuring transient voltage in power distribution networks.

Electronic devices, such as integrated circuits (IC) chips and printed circuit boards, are tested before they are packaged in an electronic product, such as a computer. Testing is essential to determine whether an electronic device's electrical characteristics conform to the specifications to which it was designed and performs the function for which it was designed. Transient voltage across one or more of contact pads of the IC chip or the printed circuit board, have the potential to damage electronic devices on the IC chip or printed circuit board. Testing devices may require soldering test leads to the IC chip or printed circuit board in order to debug the circuit; however, it is inefficient and costly to solder a test lead to every component. Furthermore, soldering and unsoldering of the test leads may damage delicate electronic components. Alternatively, an oscilloscope may be used to detect transient voltage, but even the most sophisticated oscilloscopes may only have four channels and would require a signification additional investment to purchase.

SUMMARY

According to an embodiment, an apparatus for detecting transient voltage at an electrical component of a circuit board is provided. The apparatus including a circuit including a comparator and a latch, wherein a first input of the comparator is electrically coupled to the electrical component, and the comparator receives a threshold voltage at a second input, where the comparator outputs either a high signal or a low signal in response to both the first input and the second input, and an output of the comparator is electrically coupled to an input of the latch such that the latch outputs a high signal in response to receiving a high signal from the comparator, and an indicator electrically coupled to an output of the latch such that the indicator activates in response to a high signal received from the latch, and where the apparatus is mounted non-permanently to the circuit board to provide a non-permanent electrical coupling between the comparator and the electrical component.

According to an embodiment, an apparatus for detecting transient voltage at an electrical component of a circuit board is provided. The apparatus including multiple circuits, each circuit including a circuit including a comparator and a latch, wherein a first input of the comparator is electrically coupled to an electrical component, and the comparator receives a threshold voltage at a second input, wherein the comparator outputs either a high signal or a low signal in response to both the first input and the second input, and an output of the comparator is electrically coupled to an input of the latch such that the latch outputs a high signal in response to receiving a high signal from the comparator, and multiple indicators, each electrically coupled to an output of a respective latch, such that each indicator of the multiple indicator activates in response to a high signal received from the respective latch, where each apparatus is mounted non-permanently to the circuit board to provide a non-permanent electrical coupling between the respective comparator and the electrical component.

According to another embodiment, a method for detecting transient voltage at a plurality of electrical components of a circuit board. The method including measuring voltage at each of the plurality of electrical components using a plurality of detection devices, each of which comprises a comparator and a latch, where a first input of the comparator is electrically coupled to the respective electrical component, and the comparator receives a threshold voltage at a second input, wherein the comparator outputs either a high signal or a low signal in response to both the first input and the second input, and an output of the comparator is electrically coupled to an input of the latch such that the latch outputs a high signal in response to receiving a high signal from the comparator, and an indicator electrically coupled to an output of the latch such that the indicator activates in response to a high signal received from the latch, where each of the plurality of detection devices are mounted non-permanently to the circuit board to provide a non-permanent electrical coupling between the comparator and the respective electrical component, running a software program test on the circuit board, determining one or more transient voltages based on one or more indicator and identifying one or more electrical components with transient voltage, based on the indicator of the detection device which is electrically coupled to the one or more electrical components

BRIEF DESCRIPTION OF THE DRAWINGS

The following detailed description, given by way of example and not intended to limit the invention solely thereto, will best be appreciated in conjunction with the accompanying drawings, in which not all structures may be shown.

FIGS. 6A and 6B depict cross-section views, while FIG. 6C depicts a top view of an attachment device for a transient voltage detection circuit, according to an embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
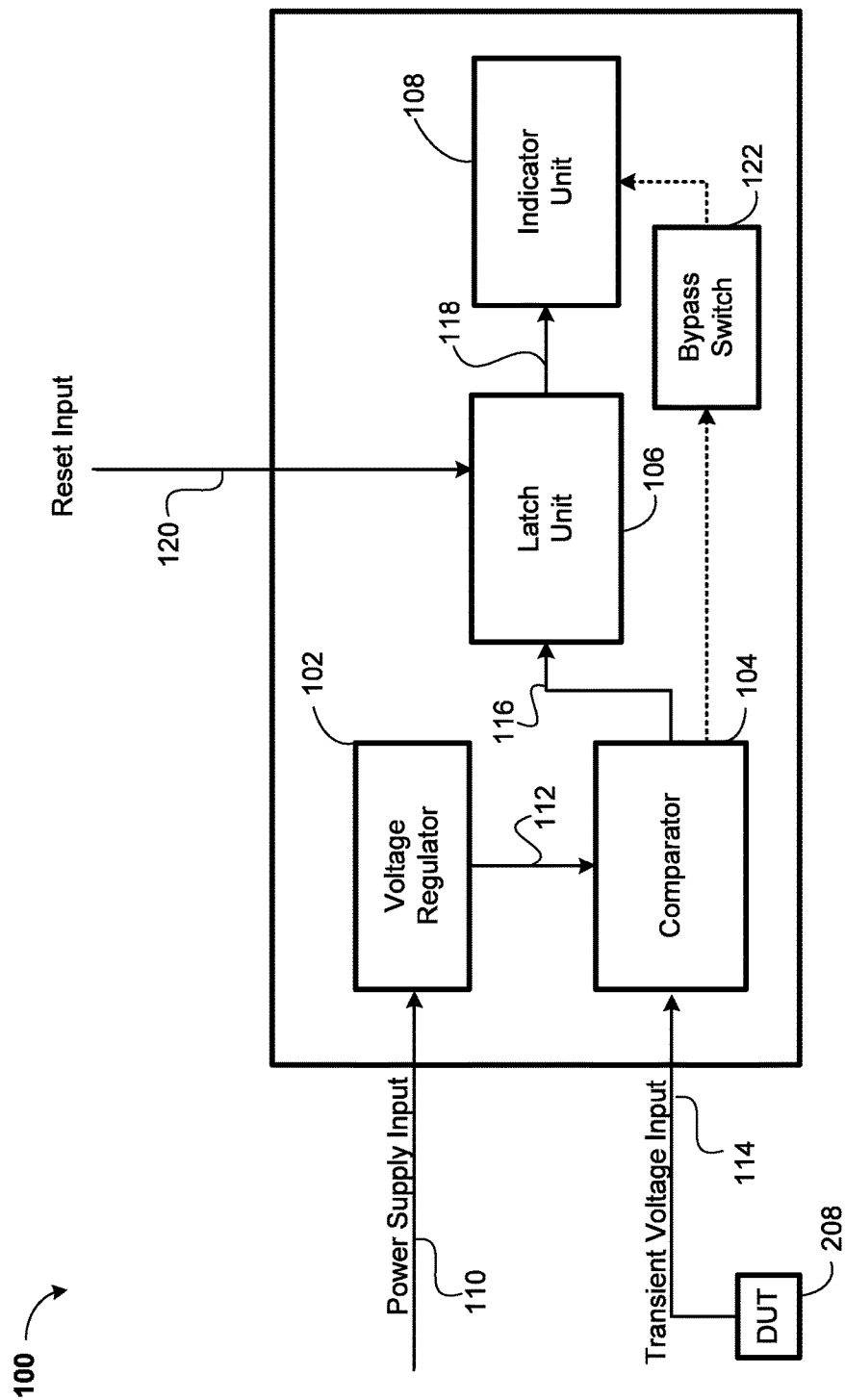
FIG. 1 depicts a block diagram for a transient voltage detection circuit, according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention.

In the interest of not obscuring the presentation of embodiments of the present invention, in the following detailed description, some elements that are known in the art may have been combined together for presentation and for illustration purposes and in some instances may have not been described in detail. In other instances, some elements that are known in the art may not be described at all. It should be understood that the following description is rather focused on the distinctive features or elements of various embodiments of the present invention.

As previously discussed, electronic devices, such as integrated circuits (IC) chips and printed circuit boards, are frequently tested before they are packaged in an electronic product, such as a computer. Testing is essential to determine whether an electronic device's electrical characteristics conform to the specifications to which it was designed and performs the function for which it was designed. Testing may be performed at or near any electronic component in a circuit to confirm functionality of the electronic component to confirm sufficient input, and output voltages. Testing may also be performed at or near a voltage source, and at various points along the voltage source signal path, in order to measure and confirm an output signal of the voltage source, and to measure the output signal at different distances from the voltage source.

Transient voltage above a threshold across one or more of the contact pads of an electronic component could potentially damage the electronic component. Additionally, transient low voltages may prevent electronic components from functioning properly or cause unintended circuit behavior. Testing may require soldering test leads to the electronic component, or in many cases the printed circuit board (PCB), in order to debug the circuit; however, doing so is inefficient and costly. Furthermore, soldering and unsoldering of the test leads may damage delicate electronic components. Traditionally, when solder material is removed after conclusion of the testing, it may often result in permanent damage to components, making it difficult to take measurements at the previously soldered components. This approach may also result in residues being left over after the solder material has been removed, which may affect the performance of the electronic component individually, or negatively affect the performance of the circuit in its entirety. Additionally, the high temperature associated with solder removal may cause permanent damage to the circuit board or nearby components. The permanent damage may not be readily apparent and may manifest during operation later. It may be advantageous to eliminate any potential for destruction to resulting from such debug test lead termination procedures.

Additionally, an oscilloscope is required to measure and detect transient voltages at the soldered test leads. The most sophisticated oscilloscopes may only have four channels and provide only a single trigger. Therefore, a conventional four channel oscilloscope is limited to measuring only four inputs or outputs of electronic components. Moreover, the single trigger allows for one threshold, either high or low, which may identify a measured input above or below a threshold voltage. Once the single trigger is turned on or triggered, the oscilloscope may begin to capture wave signal measure from each of the four inputs from four different points in a circuit. The single trigger may turn on the four channels and show measurements of the four inputs on the four channels. The four inputs do not each have an individual trigger. The single trigger from a single point of testing may only identify a single point where transient voltage above or below a threshold has occurred. Thus the oscilloscope has limited testing capabilities and can identify a single point where a transient voltage has occurred.

Consequently, a low-cost device capable of producing an auditory and/or visual notification of a transient voltage above or below a predetermined threshold without the use of solder leads may be required. Multiple low-cost devices may be used to identify multiple points where a transient voltage has occurred.

Embodiments of the present invention may be relatively inexpensive to construct using commonly available materials and also cost significantly less than an oscilloscope. Embodiments of the present invention may have multiple sensors, or circuits, which trigger independently from each other and each individual circuit may be set with a different predetermined threshold voltage for which to identify a different voltage condition. The present invention may identify transient voltages by providing an indicator, for example turning on a Light Emitting Diode (LED).

Embodiments of the present invention relate generally to testing of electronic devices, and more particularly to a structure and method of measuring transient voltage in power distribution networks. Embodiments may be used to record and notify a user of a transient voltage. Embodiments may be used in either a direct-current or alternating-current mode. Embodiments may be used to test components on integrated circuit (IC) chips, printed circuit boards (PCBs), glass ceramic package modules and organic package modules, among others. Embodiments may attach temporarily to a component, for example, a surface mount device (SMD) using spring tension or vacuum pressure or other non-permanent techniques. Embodiments may attach physically and electrically without the use of solder. Embodiments may be used as a network of devices to test a plurality of SMDs.

FIG. 1 is an exemplary block diagram of a transient voltage detection circuit (hereinafter "detection circuit") 100 utilized for detecting transient voltages in a device under test (DUT) 208, according to an embodiment. The DUT 208 may be any electrical component in any type of packaging, for example, through-hole, surface-mount, and packaged integrated-circuit. The DUT 208 may be any electronic component, such as for example, a capacitor, a resistor, a pull-up resistor, an inductor, or an integrated circuit, such as an ASIC, a processor or a memory device.

As depicted, the detection circuit 100 may include, among other things, a voltage regulator 102, a comparator 104, a latch unit 106, an indicator unit 108, and power links 112, 116, and 118. The detection circuit 100 may be configured to accept a power supply input 110, a transient voltage input 114, and a reset input 120. The detection circuit 100 may be used in an alternating-current (AC) transient voltage detection mode. The detection circuit 100 may additionally include an optional bypass switch 122 for use in a direct-current (DC) transient voltage detection mode. A switch (not shown) may be used to switch between the DC transient voltage mode and the AC transient voltage detection mode. The bypass switch 122 may decouple the comparator 104 from the latch unit 106, such that in response to activation of the bypass switch 122 the output of the comparator 104 is electrically coupled directly to the indicator unit 108, wherein the indicator unit 108 activates in response to a high signal received from the comparator 104.

In operation, the voltage regulator 102 may receive power from a power supply via the power supply input 110. The power supply may be either external or internal to the detection circuit 100. The voltage regulator 102 may be adjusted by the user to output any regulated voltage via the power link 112. In an embodiment, the voltage regulator 102 may be a voltage source coupled to a voltage divider in order to output a regulated voltage. In another embodiment, the voltage regulator 102 may be a rectifier integrated circuit capable of receiving any input voltage and outputting a regulated voltage. In yet another embodiment, the voltage regulator 102 may be a Zener diode with a specified reverse voltage. In an embodiment, a power supply voltage to the detection circuit 100 may come from a voltage capacitor on the detection circuit 100. An average calculator may average voltage measurements and use the calculated average voltage measurements to set a predetermined threshold voltage $V_T$. The comparator 104 may receive the regulated voltage via the power link 112 and a transient voltage measurement from the DUT 208 via the transient voltage input 114. The comparator 104 may continuously compare the received regulated voltage from the voltage regulator 102 and the received transient voltage measurement from the transient voltage input 114.

When the detection circuit 100 is testing for a high transient voltage, and the transient voltage measurement is less than the received regulated voltage, the comparator 104 may output a low signal on the power link 116. When the transient voltage measurement is greater than the received regulated voltage, the comparator 104 may output a high signal on the power link 116. Alternatively, when the detection circuit 100 is testing for a low transient voltage, if the transient voltage measurement is higher than the received regulated voltage, the comparator 104 may output a low signal on the power link 116. When the transient voltage measurement is lower than the received regulated voltage, the comparator 104 may output a high signal on the power link 116. Because a transient voltage may only last as long as a few nanoseconds, the length of time may not be observable to the naked eye if fed directly to the indicator unit 108. Thus, the latch unit 106 may be used to allow the user to identify that a transient voltage has occurred. The latch unit 106 allows detection by the user of the transient voltage by capturing and slowing down the transient voltage. It may be appreciated that the latch unit 106 may be any of a number of devices, such as a NOR gate, a bistable multivibrator, an antifuse, a Schmitt trigger, or a monostable multivibrator having a time constant that may be several orders of magnitude larger than the length of the transient voltage above or below a predetermined threshold.

A constant output signal from the latch unit 106 may be input into the indicator unit 108. The indicator unit 108 may be an audiovisual or tactile notification device, such as a light bulb, light-emitting diode, buzzer, siren, vibration motor, or the like. When the latch unit 106 outputs a constant high signal on the power link 118 to the indicator unit 108, the indicator unit 108 may turn on, and thus notify the user of a transient voltage. The indicator unit 108 may remain on until the detection circuit 100 is reset by the user via the reset input 120.

Figure 2:
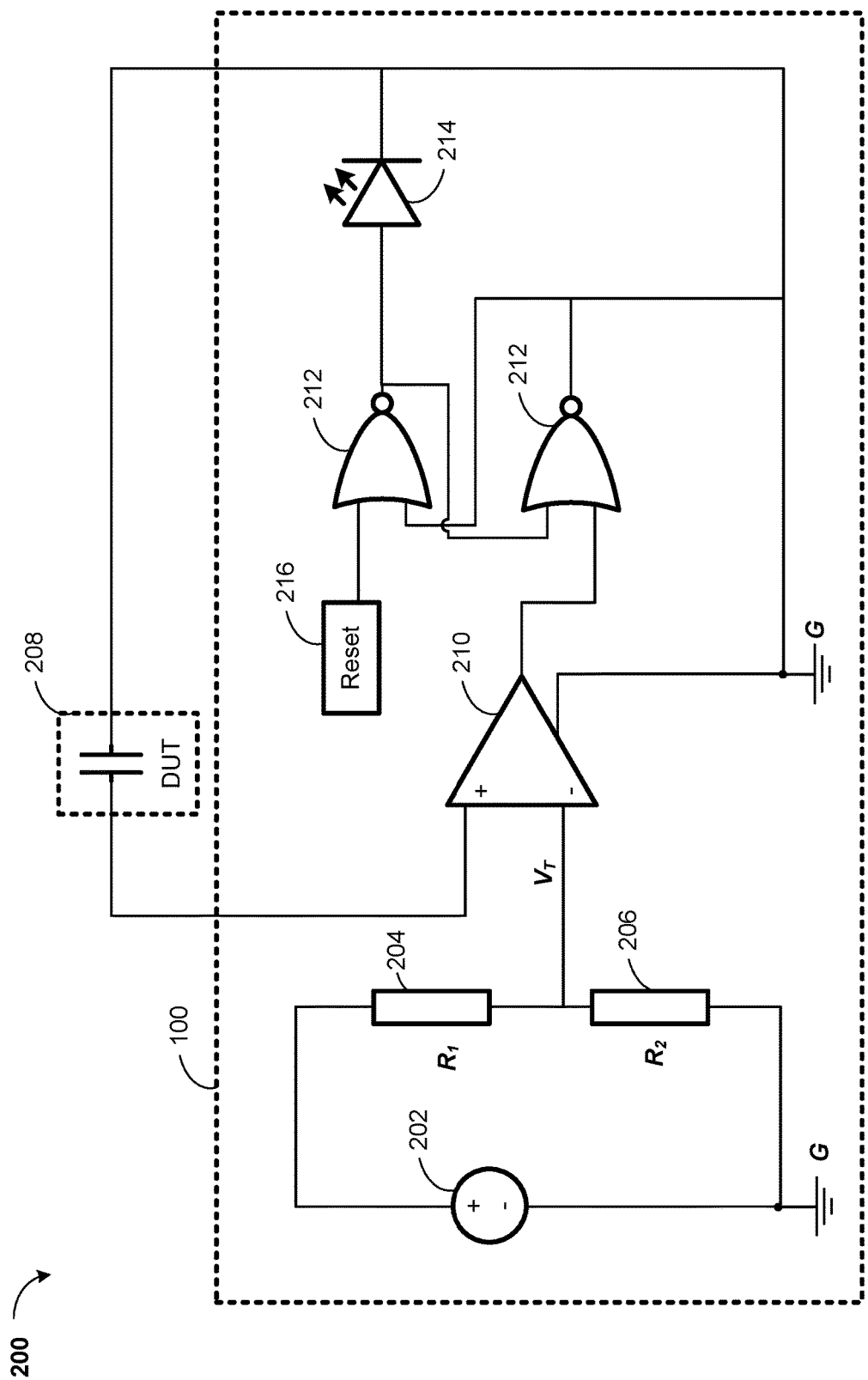
FIG. 2 depicts a circuit diagram for the transient voltage detection circuit, according to an embodiment.

Referring to FIG. 2, an exemplary circuit diagram 200 of the detection circuit 100 (FIG. 1) is depicted, according to an embodiment. As illustrated, the circuit diagram 200 may contain a voltage source 202, a resistor 204 having a resistance R1, a resistor 206 having a resistance R2, an operational amplifier (op-amp) 210, one or more NOR gates 212, a light-emitting diode (LED) 214, and a reset switch 216. The detection circuit 100 may be electrically coupled to (the DUT 208 and may be used to detect a transient voltage across the DUT 208. It may be appreciated that the components of the detection circuit 100 depicted by the circuit diagram 200 may be in packaged any number of ways, such as through-hole, surface-mount, and packaged integrated-circuit. The DUT 208 may be in any type of packaging, for example, through-hole, surface-mount, and packaged integrated-circuit. As previously described, the DUT 208 may be any electronic component, such as for example, a capacitor, a resistor, a pull-up resistor, an inductor, or an integrated circuit, such as an ASIC, a processor or a memory device.

In operation, the voltage source 202 may provide power to operate to the detection circuit 100. In an embodiment, the voltage source 202 may be an external source, such as a switched-mode power supply, or may be an internal source, such as a battery. The resistors 204 and 206 may be used to allow a user to set a predetermined threshold voltage $V_T$ for the detection circuit 100 with respect to ground G. For example, if a battery were used as the voltage source 202, a user may select a combination of values of $R_1$ and $R_2$ for the respective resistors 204 and 206 in order to set the predetermined threshold voltage $V_T$. It may be appreciated that the resistors 204 and 206 may be any type of resistor, such as carbon pile, carbon film, printed carbon, metal film, metal-oxide film, etc. It may be further appreciated that either or both of the resistors 204 and 206 may be substituted for a potentiometer, rheostat, or other adjustable resistor to allow for finer calibration of the predetermined threshold voltage $V_T$. In an embodiment, a variable resistor may be used for the resistors 204 or 206. The variable resistor may allow the detection circuit 100 to be tuned in a calibration step during testing of the DUT 208. The predetermined threshold, $V_T$, may be determined by a ratio of $R_2$ to a combined $R_1$ and $R_2$, wherein resistors 204 and 206 are in series across a voltage output of the voltage source 202 of FIG. 2, to provide the predetermined threshold voltage $V_T$, such as the regulated voltage via the power link 112 from the voltage regulator 102 of FIG. 1. One end of the resistor 204 may be connected to the voltage source 202, while one end of the resistor 206 may be connected to ground. A second end of the resistor 204 may be connected to the voltage source 202, and a second end of the resistor 206 may be connected to ground. The predetermined threshold voltage $V_T$ may be provide at the point where the resistor 204 and the resistor 206 are connected in series.

In an embodiment, the predetermined threshold voltage $V_T$ may be a first predetermined threshold voltage $V_{T1}$ to determine if a transient voltage detected is above the first predetermined threshold. Alternatively, the predetermined threshold voltage $V_T$ may be a second predetermined threshold voltage $V_{T2}$ to determine if a transient voltage detected is below the second predetermined threshold. The detection circuit 100 may be set to determine if a transient voltage is detected above the first predetermined threshold, $V_{T1}$, or, alternatively, the detection circuit 100 may be set to determine if a transient voltage is detected below the second predetermined threshold, $V_{T2}$.

In an embodiment, the comparator 104 as shown in FIG. 1 may include the op-amp 210 for comparing the voltage across the DUT 208 to the first predetermined threshold voltage $V_{T1}$. For example, if the voltage across the DUT 208 is higher than the first predetermined threshold voltage $V_{T1}$, the op-amp 210 may output a high signal, or ON signal.

Conversely, if the voltage across the DUT 208 is lower than the first predetermined threshold voltage $V_{T1}$, the op-amp 210 may output a low signal, or OFF signal. The one or more NOR gates 212 may be coupled in such a way as to form a latch circuit with the output of the op-amp 210 coupled as an input to the latch circuit. A low output from the op-amp 210 may cause no activity in the latch circuit and remain OFF, while a high output from the op-amp 210 may cause the latch circuit to activate and output a high signal, or turn ON. The output of the latch circuit may be coupled to the LED 214, whereby the latch circuit outputting a high signal, may cause the LED 214 to illuminate. Accordingly, an excursion of the voltage of the DUT 208 above the first predetermined threshold voltage $V_{T1}$ may cause the op-amp 210 to output a high signal, triggering the latch circuit and illuminating the LED 214. Thus, a user will be able to visually determine, based on the illumination of the LED 214, that the DUT 208 has experienced a transient voltage above the first predetermined threshold voltage $V_{T1}$.

The user may then use the reset switch 216 to deactivate the latch by forcing a low output signal from one of the NOR gates 212, thus causing the LED 214 to power off, and reset the circuit. When the reset switch 216 is used, the latch unit 106 of FIG. 1 may output a low signal, or an OFF signal. It may be appreciated that in the case of DC transient voltages, the NOR gates 212 may be bypassed. Accordingly, the output of the op-amp 210 may be directly connected to the input of the LED 214.

In an alternative embodiment, the op-amp 210 may compare the voltage at a connection of the DUT 208, or across the DUT 208, to the second predetermined threshold voltage $V_{T2}$. For example, if the voltage across the DUT 208 is lower than the predetermined threshold voltage $V_{T2}$, the op-amp 210 may output a high signal. Conversely, if the voltage across the DUT 208 is higher than the second predetermined threshold voltage $V_{T2}$, the op-amp 210 may output a low signal. The one or more NOR gates 212 may be coupled in such a way as to form a latch circuit with the output of the op-amp 210 coupled as an input to the latch circuit. A low output from the op-amp 210 may cause no activity in the latch circuit, while a high output from the op-amp 210 may cause the latch circuit to activate and output a high signal. The output of the latch circuit may be coupled to the LED 214, whereby the latch circuit outputting a high signal may cause the LED 214 to illuminate. Accordingly, an excursion of the voltage of the DUT 208 below the second predetermined threshold voltage $V_{T2}$ may cause the op-amp 210 to output a high signal, triggering the latch circuit and illuminating the LED 214. Thus, a user will be able to visually determine, based on the illumination of the LED 214, that the DUT 208 has experienced a transient voltage below the second predetermined threshold voltage $V_{T2}$. As described above, the user may then use the reset switch 216 to reset the latch circuit, which will then output a low signal and turn OFF the LED 214.

In an embodiment, the detection circuit 100 of FIG. 1 may have a first connection on one side of a capacitor in a circuit. The first connection may be used to detect a transient voltage either above a first predetermined threshold voltage $V_{T1}$ or below the second predetermined threshold voltage $V_{T2}$. In an alternate embodiment, the detection circuit 100 may have a first connection on one side of a pull up resistor in a circuit. A second connection of the detection circuit 100 may be connected to a signal driver. The first connection may be used to detect a transient voltage either above a first predetermined threshold voltage $V_{T1}$, or below the second predetermined threshold voltage $V_{T2}$. In an additional embodiment, the detection circuit 100 may have a first connection on one side of a termination resistor at a receiver of a circuit. A second connection of the detection circuit 100 may be connected to a signal driver. The first connection may be used to detect a transient voltage either above a first predetermined threshold voltage $V_{T1}$ or below the second predetermined threshold voltage $V_{T2}$. In another embodiment, the detection circuit 100 may have a first connection on one side of an inductor in a circuit. A second connection of the detection circuit 100 may be connected to ground. The first connection may be used to detect a transient voltage either above a first predetermined threshold voltage $V_{T1}$ or below the second predetermined threshold voltage $V_{T2}$.

Figure 3B:
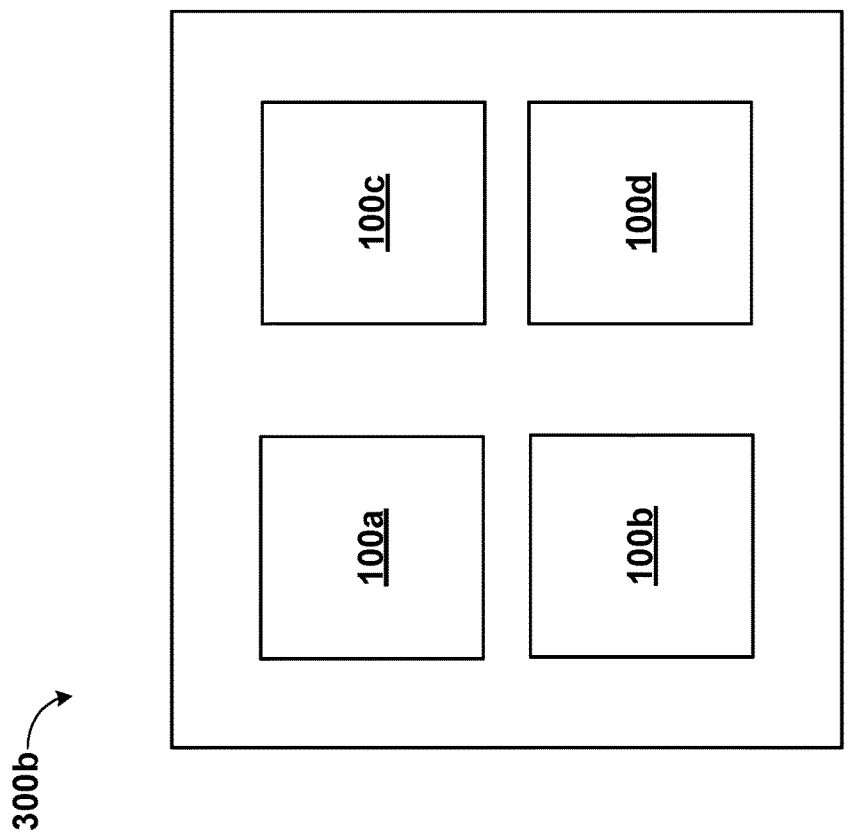
FIGS. 3A and 3B depict detection devices, according to an embodiment.
Figure 3A:
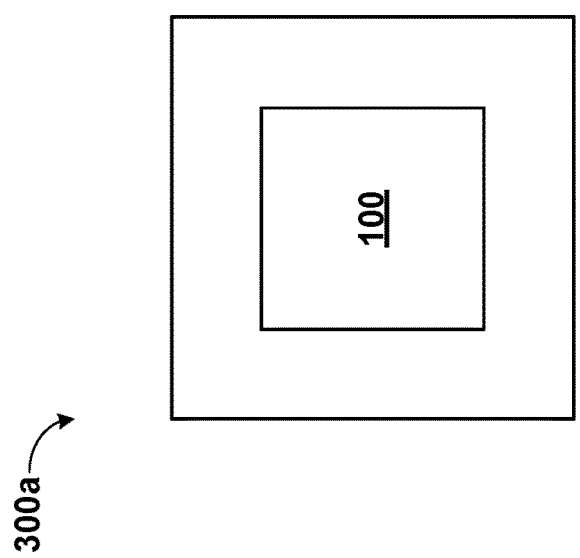

Referring now to FIGS. 3A and 3B, detection devices 300a and 300b are illustrated according to an embodiment. The detection package 300a may include a single detection circuit 100 (FIG. 2). In an embodiment, the detection device 300a can be electrically coupled to a single device under test as described above. The detection device 300a includes one detection circuit 100 and is capable of testing a single voltage condition at a particular electronic component. Specifically, for example, the detection circuit 100 of the single detection device 300a may be set or tuned with a single predetermined threshold voltage ($V_T$) capable of identifying a voltage condition either above or below the predetermined threshold voltage $V_T$. As such, the detection device, and similarly, the single detection circuit 100 may be fitted with only one or two indicators, such as, LEDs. In the case of a single LED, only one voltage condition either above or below can be visually identified. Therefore, during testing the LED would only emit light after the voltage condition had been reached. In the case of two LEDs, voltage conditions both above and below the predetermined threshold can be visually identified. Therefore, during testing one LED, for example a green LED, would emit light before the voltage condition had been reached, and another LED, for example a red LED, would emit light after the voltage condition had been reached.

The detection device 300b may include a plurality of detection circuits 100a, 100b, 100c, and 100d. The plurality of detection circuits 100a-100d, may each be substantially similar to the detection circuit 100 described above with reference to FIG. 2. In an embodiment, the detection device 300b may be electrically coupled to a single device under test as described above. Because the detection device 300b includes multiple detection circuits (100a-100d) it is capable of simultaneously testing multiple voltage conditions at a particular electronic component. For example, the detection device 300b, with four detection circuits (100a-100d) will be capable of testing for four different voltage conditions either above or below four different threshold voltages $V_T$. More specifically, for example, both the detection circuits 100a and 100b may be set with the same threshold voltage ($V_T$); however, the detection circuit 100a may identify a voltage condition which exceeds the predetermined threshold voltage while the detection circuit 100b may identify a voltage condition below the predetermined threshold voltage. The predetermined threshold voltages of the detection circuits 100c and 100d may be set to identify voltage conditions within or exceeding a broader or more narrow range than the detection circuits 100a and 100b.

In an example, the detection device 300b may be connected to a signal driver which has a desired output between 1.75V and 2.25V. The detection circuits 100a, 100b, may be set to identify if the signal driver has a voltage outside of this voltage range, with the detection circuit 100a set to a first predetermined threshold voltage $V_{T1}$ of 2.25V and the detection circuit 100b set to a second predetermined threshold voltages $V_{T2}$ of 1.75V. In operation, the detection circuit 100a may be triggered to light up if the voltage measured at the signal driver is above or exceeds 2.25V, and the detection circuit 100b may be triggered to light up if the voltage measured at the signal driver is below 1.75V.

Meanwhile, the detection circuits 100c, 100d, may be set to identify if the voltage measured at the signal driver exceeds a wider narrow voltage range, for example 1.70V and 2.30V. The detection circuit 100c may be set to a third predetermined threshold voltage $V_{T3}$ of 2.30V and the detection circuit 100d may be set to a fourth predetermined threshold voltages $V_{T4}$ of 1.70V. In operation, the detection circuit 100c may be triggered to light up if the voltage measured at the signal driver is above or exceeds 2.30V, and the detection circuit 100d may be triggered to light up if the voltage measure at the signal driver is below 1.70V.

In an alternate embodiment, the detection circuits 100c, 100d, may be set to identify if the signal driver went outside of a more narrow voltage range, for example 1.8V and 2.20V.

As previously described, each detection circuit 100a-100d of the detection device 300b may be fitted with an individual reset, for example the reset switch 216 as described above in relation to FIG. 1. Alternatively, the detection device 300b may be fitted with one group reset for all of the detection circuits 100a-100d.

The detection device 300b of the present example includes four detection circuits 100a-100d; however, it may include a greater or fewer number of detection circuits based on testing requirements.

Figure 4:
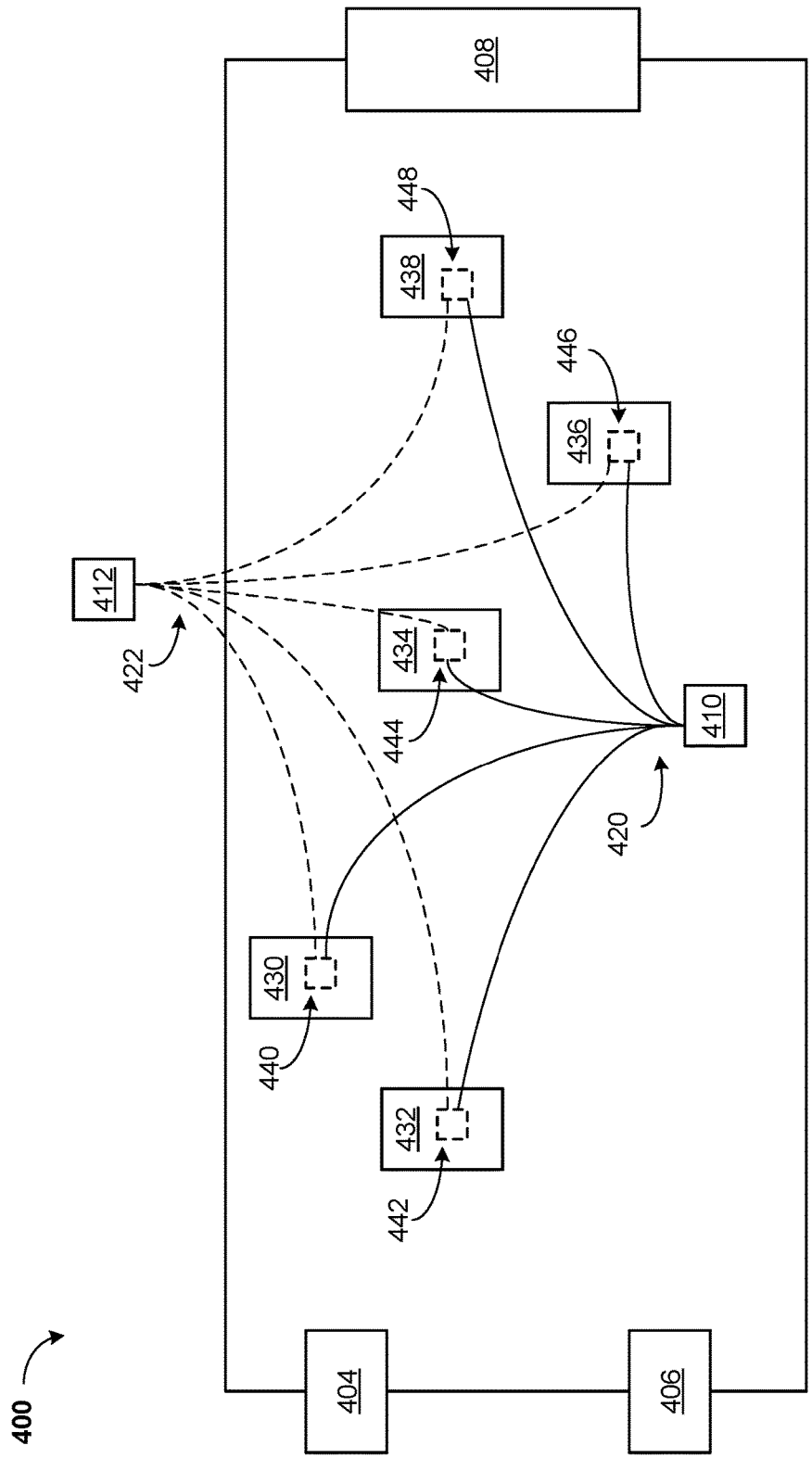
FIG. 4 depicts a circuit board, according to an embodiment.

Referring to FIG. 4, a circuit board 400 is depicted, according to an embodiment. The circuit board 400 may include external connectors 404, 406 and 408. The circuit board 400 may include a reference voltage generator 410 and be connected to an external power supply 412. The circuit board 400 may include detection devices 430, 432, 434, 436, and 438. The detection devices 430-438, may each be substantially similar to the detection devices 300a/b described above with reference to FIG. 3. Each of the detection devices 430-438, may be mounted to a front side of the circuit board 400 and electrically coupled to a respective device under test 440, 442, 444, 446, and 448. A set of wires 420 may provide a reference voltage from the reference voltage generator 410 to each of the detection devices 430-438. The reference voltage produces a constant voltage, and as described above, the resistors 204 and 206 of FIG. 2, may be used to allow a user to set an individual predetermined threshold voltage $V_T$ for each the detection circuit 100 on each detection device 430, 432, 434, 436, and 438, by using a ratio of the resistors 204 and 206 to set the individual predetermined threshold voltage $V_T$ as a ratio of the reference voltage. Another set of wires 422 may provide power from the external power supply 412 to each of the detection devices 430-438. Alternatively, rather than using a common power supply from the external power supply 412, each of the detection devices 430-438 may be powered directly from the circuit board 400; however, the detection devices 430-438 may require a different voltage as a power supply than that available on the circuit board 400.

In an alternative configuration, each detection device may not be wired to a common reference voltage, for example reference voltage generator 410, but rather is fitted with an onboard averaging device and designed to detect or identify a relative change in voltage drop between the electronic component to which it is coupled and the average value at its output.

Five detection devices 430-438 are illustrated and described; however, there may be more or less than five detection devices 430-438 connected to various electronic components of the circuit board 400. The ability to use a plurality of detection devices to simultaneously conduct voltage threshold testing across an entire circuit board is a particular advantage of the disclosed embodiments. Doing so will allow for quick identification of problem areas of the circuit board 400 during operational testing. For example, a particular corner of the circuit board 400 furthest away from a voltage source may experience an undesirable voltage drop. Such a voltage drop would be identified by LEDs of the detection devices located and coupled with electrical components in that corner. As described, a number of detection device used on a single circuit board may only be limited by their physical size. For example, it may be advantageous to use 10 or 20 detection devices depending on the size of the circuit board 400. More detection devices may offer increase granularity in identifying physical locations across the circuit board with voltages either above or below the predetermined threshold.

An advantage of using multiple detection devices is simultaneous testing of multiple points in the circuit board 400, and simultaneous testing of individually set voltage thresholds. This reduces testing time for a user and eliminates the need for the use of multiple oscilloscopes, which would be costly.

In an example, each of the five detection devices 430-438 may be electrically coupled to different electronic components across the circuit board 400. For example, the detection devices 430, 438 may be electrically coupled to the DUTs 440, 448, respectively. In the present example the DUTs 440 and 448 may be an integrated circuit, such as an ASIC or a processor, mounted on a back side of the circuit board 400 opposite the detection devices 430, 438. In such cases, the detection device 430 may be electrically connected by a via which forms the electrical connection to the DUT 440 through the circuit board 400. Alternately, the detection devices 430, 438 may connect to pins of the DUTs 440, 448 which extend through the circuit board 400. For example, the DUTs 442, 444, and 446, may be a typical pin-in-hole component or surface mount device, such as a capacitor, resistor or inductor, soldered to the front side of the circuit board 400. The detection devices 432, 434, and 436, may be electrically coupled to the DUTs 442, 444, and 446, respectively. It should be noted that each detection device (430-438) maybe electrically coupled to any single component of the circuit board regardless of which side of the circuit board 400 either the component or detection device 430-438 are located. In addition to being powered, each of the detection devices 430-438 may also be connected to ground.

Each detection device 430-438 may be physically mounted to and electrically coupled to an electrical component, where the electrical component may be on either side of the circuit board 400, and the detection devices 430-438 may all be on the same side of the circuit board. Additionally, securing all of the detection devices to the same side of the circuit board 400 will allow a user to see the visual indicators, for example, LEDs.

As shown in FIG. 4, multiple transient voltage detection devices may be used simultaneously to identify stray voltage among a variety of electrical components. The detection devices 430-438, may be powered by the external power supply 412. Alternatively, the detection devices 430-438, may each have their own power supply, or may use a power supply available on the circuit board 400. Each detection device may also be fitted with an individual reset, for example the reset switch 216 as described above in relation to FIG. 2. Alternatively, there may be a single group reset for all or some of the detection devices 430-438.

Each of the detection devices 430-438, are designed with an individual predetermined threshold voltage $V_T$. The predetermined threshold voltages, $V_T$, of each detection devices 330-338 may be set to determine a stray voltage either above or below their respective predetermined threshold voltages, $V_T$.

In operation, the detection devices 430-438, may be used to test stray voltage across a circuit, such as on the circuit board 400. A software program, commonly referred to as exercisers, or a software program test, may be used to test circuit functionality. These exercisers will run different circuit functions to simulate the circuit's operation, for example an input/output push, a functional test program, or reading and writing to and from different IC chips. The detection devices 430-438, may be used to test a processor in a circuit, for example simulating transactions such as weather calculations or credit card transactions. In an embodiment, transient voltage triggers and time of trigger may be recorded for future use.

In an embodiment, the detection devices 430-438, may be used to measure a voltage drop of a voltage regulator across a circuit. It may be expected, in direct current (DC) mode, the majority of the LEDs associated with each of the detection devices 430-438, may be in an OFF state, or not emitting light, in proximity of the voltage regulator, and potentially the LEDs may be in an ON state (emitting light), in proximity of a major source of current, which may signal a DC drop greater than a pre-determined value.

Figure 5:
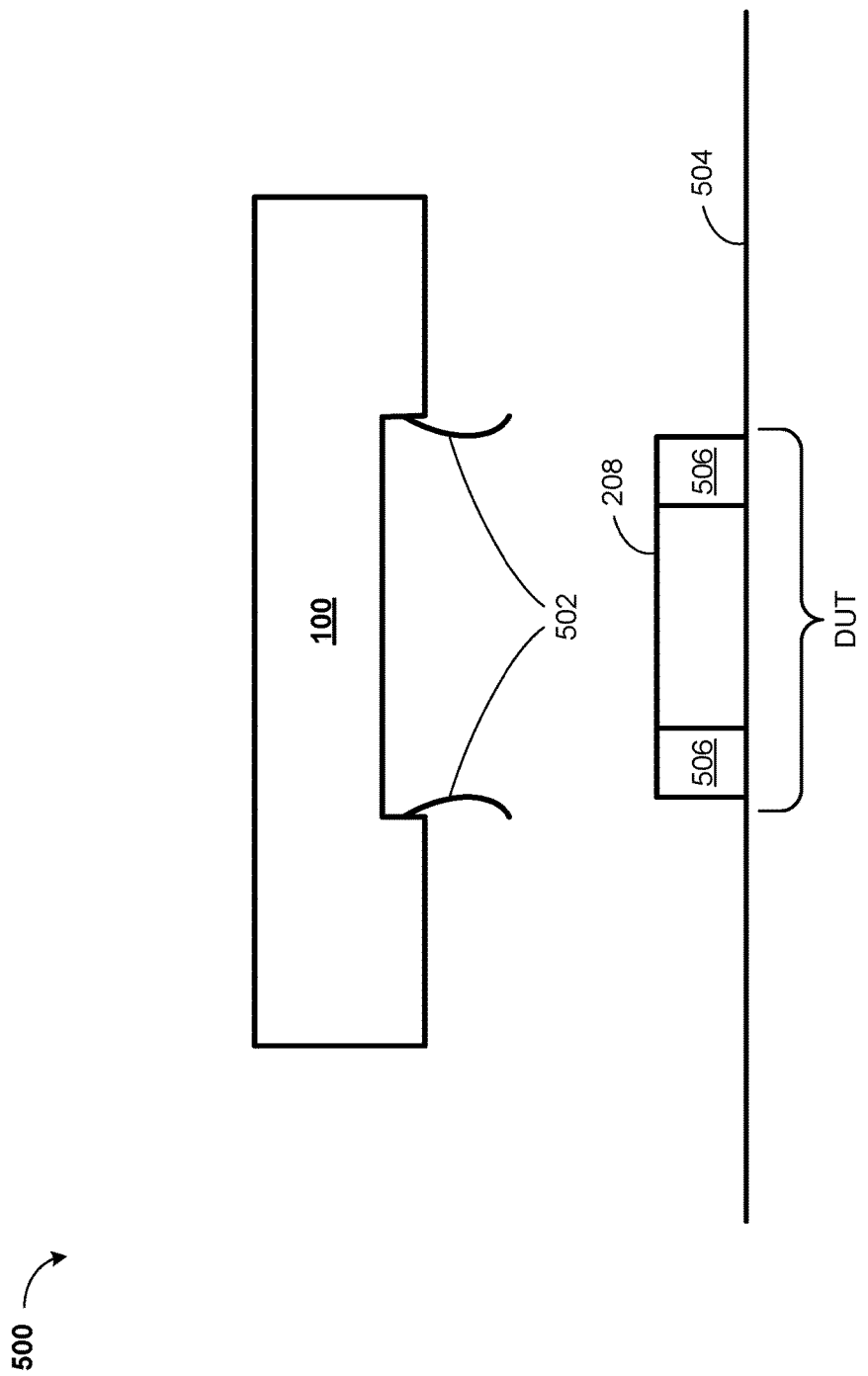
FIG. 5 depicts a side view of a detection device and a circuit board with a device-under-test, according to an embodiment.

Referring now to FIG. 5, a system block diagram 500 corresponding to a detection circuit 100 (FIG. 1) is depicted, according to an embodiment. FIG. 5 may be described with the aid of the exemplary circuit of FIG. 2. The detection circuit 100 may include an attachment device 502. The attachment device 502 may be coupled mechanically to the body of the detection circuit 100. The attachment device 502 may further be coupled electronically to the input of the op-amp 210 (FIG. 2) and to ground G (FIG. 2) in order to allow an electrical connection to the detection circuit 100. The transient voltage detection device may be used to detect transient voltages across electronic components, such as the DUT 208 surface-mounted to a substrate 504. The DUT 208 may have one or more regions 506 that are soldered to traces on the substrate 504 in order to provide a physical and electrical connection between the DUT 208 and the substrate 504. Accordingly, the attachment device 502 may physically grasp regions 506 of the DUT 208 to provide a corresponding docking of a physical and electrical connection of the DUT 208 to the detection circuit 100. In an embodiment, an underside of the detection circuit 100 may rest on an upper surface of the DUT 208 for stability. In an embodiment, the attachment device 502 may be a pair of spring clips that maintain tension on the regions 506 of the DUT 208 when docking. Alternatively, the attachment device 502 may be a device as described below in FIGS. 6A, 6B and 6C. It may be appreciated that for ease of description, only one DUT 208 is depicted. However, there may be a plurality of DUTs 208 to which a plurality of detection circuits 100 may be coupled to, in order to debug the plurality of DUTs 208 as a network.

Referring to FIGS. 6A and 6B, a cross-section view and a front view illustrating an exemplary attachment device 502 of FIG. 5 that may be used to connect a detection circuit 100 (FIG. 1) to the DUT 208 is shown according to an embodiment. FIG. 6C illustrates a top view, or mating surface, of the DUT 208. The attachment device 602 of FIGS. 6A and 6B illustrates an embodiment of a microprobe testing termination device used in testing the DUT 208. In an embodiment, the attachment device 602 includes a non-conductive platform 601, a non-conductive screw 603 that drives a non-conductive suction mechanism 609, one or more spring-loaded fingers 607 each having a bent lower portion ending at a tip 613 and an upper end connected to one or more surface mount technology (SMT) device contact terminations (hereinafter "SMT terminations") 605, and a depth gauge 625 that includes a spindle 615 and a spring 617. The DUT 208, of FIG. 6C, may include a top surface that may possess a certain degree of planarity to permit the suction mechanism 609 to form an airtight fit with the DUT 208 to facilitate proper contact between one or more contact pads 621 of the DUT 208 and the tip 613 of the spring-loaded finger 607. The platform 601 includes a channel 611 housing the screw 603 that controls the suction force of the suction mechanism 609. In various embodiments, the platform 601 may be made from various non-conductive materials and constructions including single and multi-layer ceramic, resin, or epoxy glass laminate construction. The geometry of the platform 601 may be customized to correspond to a geometry of the DUT 208 being tested.

The spring-loaded finger 607 may be attached to a vertical surface of the platform 601. An upper end of a spring-loaded finger 607 may be in electrical contact with one or more SMT terminations 605 and a lower portion of the spring-loaded finger 607 may extend below a lower surface of the platform 601, as shown in FIGS. 6A and 6B. The lower portion of the spring-loaded finger 607 may be bent to facilitate compression of the spring loaded finger when downward force along the z-axis is applied on the spring loaded finger to facilitate adequate electrical contact between a tip 613 of the spring-loaded finger 607 and the contact pad 621 of the DUT 208. In some embodiments, the spring-loaded finger 607 may include two or more bends that allow a height of the spring-loaded finger 607 to change due to bending as compression pressure is applied to it. In an embodiment, the lower portion of the spring-loaded finger 607 may be bent at approximately a sixty degree angle near the tip 613 such that the tip 613 extends in a direction generally away from a vertical side of the spring-loaded finger 607 and toward the contact pad 621 of the DUT 208. The spring-loaded finger 607 may represent a contact element with a rectangular cross-section or a square cross-section. As previously discussed, the upper end of the spring-loaded finger 607 may be in electrical contact with one or more SMT terminations 605. The SMT termination 605 may be mounted on an upper surface of the platform 601, as shown in FIGS. 6A and 6B, and may be in electrical contact with the contact pad 421 via the spring-loaded finger 607. In an embodiment, the SMT termination 605 may be soldered to the upper end of the spring-loaded finger 607. The SMT device contact termination 605 may permit electrical contact between one or more SMT devices (not shown) and the contact pad 621. The SMT devices, which may include inductors, resistors and capacitors, among others, may operate to terminate electrical connections to contact pads 621 of the DUT 208 that the spring-loaded finger 607 may be in electrical contact with.

The screw 603 and the suction mechanism 609 may provide a means of compressing the spring-loaded finger 607 to facilitate an adequate level of electrical contact between the spring-loaded finger 607 and the contact pad 621 to accomplish adequate termination of the contacted contact pads, while probe testing is undertaken via other non-contacted contact pads (not shown) of the DUT 208. The suction mechanism 609 represents a means for providing temporary suction force and includes a stiff support member in rigid contact with the screw 603, and an elastically-deformable membrane. Both the support member and the membrane comprise dielectric material that may be in electrically-insulated relationship with the DUT 208 when suction mechanism 609 makes contact with the DUT 208. In an embodiment, the suction mechanism 609 may be composed of rubber or similar materials. The membrane of suction mechanism 609 has a first and a second main face, and is attached to an underside of the support member at its first main face. In an embodiment, the suction mechanism 609 may include a folded bellow set up. It should be understood that suction mechanism 609 may be of any shape necessary to adapt to the DUT's geometry. The suction cup and screw mechanism may reduce or eliminate electrical capacitive and inductive effects caused by inadequate contacts with the contact pads of the DUT. The screw 603 may be capable of moving up and down within the channel 611 of the platform 601 along the z-axis. Turning the screw 603 while suction mechanism 609 makes a substantially airtight hermetic seal on a surface of the DUT 208 may cause the suction mechanism 609 to pull a vacuum. This in turn may reduce a relative vertical gap along the z-axis between the platform 601 and the surface of the DUT 208. The spring-loaded finger 607 may make contact with the contact pad 621 and bend due to compression pressure resulting in the tip 613 making adequate level of electrical contact with contact pads 621. The depth gauge 625 may operate to detect and measure proper compression of the spring-loaded finger 607.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An apparatus for detecting transient voltage at an electrical component of a circuit board, the apparatus comprising:
    a comparator and a latch, wherein a first input of the comparator is electrically coupled to the electrical component, and the comparator receives a threshold voltage at a second input, wherein the comparator outputs either a high signal or a low signal in response to both the first input and the second input, and an output of the comparator is electrically coupled to an input of the latch such that the latch outputs a high signal in response to receiving a high signal from the comparator,
    an indicator electrically coupled to an output of the latch, such that the indicator activates in response to a high signal received from the latch,
    wherein the apparatus is mounted non-permanently to the circuit board to provide a non-permanent electrical coupling between the apparatus and the electrical component; and
    an attachment device comprising a microprobe testing termination device, wherein the microprobe testing termination device comprises a non-conductive platform, a non-conductive screw, one or more spring loaded fingers, and a depth gauge,
    wherein the attachment device provides a physical connection between the apparatus and the circuit board, wherein the non-conductive platform comprises a channel housing the non-conductive screw which controls a suction force of a suction mechanism, wherein the non-conductive screw and the suction mechanism control a temporary suction force between the circuit and the electrical component, and the suction mechanism control comprises a non-conductive stiff support member in rigid contact with the non-conductive screw and an elastically-deformable membrane,
    wherein the attachment device provides an electrical connection between the comparator and the electrical component, wherein an upper end of a first spring loaded finger of the one or more spring loaded fingers is electrically connected to the comparator, and a lower end of the first spring loaded finger provides an electrical connection to a contact pad of the electronic component.

2. The apparatus of claim 1 further comprising:
    a first resistor and a second resistor connected in series across a voltage output of a voltage regulator, wherein the first resistor is connected to a voltage regulator output and the second resistor is connected to ground, wherein the threshold voltage is provided at a connection between the first resistor and the second resistor, and the threshold voltage is based on a ratio of a resistance of the second resistor to a combined resistance of both the second resistor and the first resistor.

3. The apparatus of claim 1, wherein the comparator outputs a high signal in response to receiving a first input greater than the threshold voltage.

4. The apparatus of claim 1, wherein the comparator outputs a high signal in response to receiving a first input less than the threshold voltage.

5. The apparatus of claim 1 further comprising:
    a reset switch electrically coupled to the respective latch, wherein the latch outputs a low signal in response to activation of the reset switch, deactivating the indicator.

6. The apparatus of claim 1 further comprising:
    a bypass switch which decouples the comparator from the latch, such that in response to activation of the bypass switch the output of the comparator is electrically coupled directly to the indicator, wherein the indicator activates in response to a high signal received from the comparator.

7. The apparatus of claim 1, wherein the latch comprises at least one of a NOR gate, a bistable multivibrator, a Schmitt trigger, an antifuse, and a monostable multivibrator, and the indicator comprises at least one of a light bulb, a light-emitting diode, a piezoelectric buzzer, and a vibration motor.

8. The apparatus of claim 1, further comprising:
    a group of comparators, a corresponding group of latches, and a group of indicators, wherein the first inputs of each respective comparator are electrically coupled to a single electrical component on the circuit board.

* * * * *